United States Patent
Liu et al.

(10) Patent No.: US 10,138,547 B2
(45) Date of Patent: Nov. 27, 2018

(54) SUBSTRATE CARRYING APPARATUS AND SPUTTERING DEVICE COMPRISING THE SAME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Jun Liu, Beijing (CN); Xu Shi, Beijing (CN); Dongqing Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 218 days.

(21) Appl. No.: 15/131,929

(22) Filed: Apr. 18, 2016

(65) Prior Publication Data

US 2016/0362779 A1 Dec. 15, 2016

(30) Foreign Application Priority Data

Jun. 10, 2015 (CN) .......................... 2015 1 0320543

(51) Int. Cl.
C23C 14/50 (2006.01)
C23C 14/34 (2006.01)

(52) U.S. Cl.
CPC ............ *C23C 14/505* (2013.01); *C23C 14/34* (2013.01); *C23C 14/50* (2013.01)

(58) Field of Classification Search
CPC ................................................. C23C 14/50
See application file for complete search history.

(56) References Cited

U.S. PATENT DOCUMENTS

| 2010/0126415 A1* | 5/2010 | Ishino | ................. B65G 49/061 |
| | | | 118/500 |
| 2010/0175990 A1* | 7/2010 | Ishino | .................... C23C 14/34 |
| | | | 204/192.12 |
| 2011/0020097 A1* | 1/2011 | Franz | ................. B65G 49/061 |
| | | | 414/225.01 |

FOREIGN PATENT DOCUMENTS

| CN | 1670743 A | 9/2005 |
| CN | 201567369 U | 9/2010 |

(Continued)

OTHER PUBLICATIONS

Office Action in Chinese Application No. 201510320543.6 dated Oct. 9, 2016, with English translation. 11 pages.

(Continued)

*Primary Examiner* — Jason Berman
(74) *Attorney, Agent, or Firm* — Womble Bond Dickinson (US) LLP

(57) ABSTRACT

The present invention relates to a technical field of display, and discloses a substrate carrying apparatus. The apparatus comprises: a vertical bearing plate and an upper holding base; one side surface of the vertical bearing plate is a bearing surface, the upper holding base is provided at the upside of the bearing surface; the upper holding base is provided with a plurality of holder for holding the substrate; the left and right sides of the bearing surface are provided with a plurality of positioning clips for positioning the substrate from the left and right ends of the substrate. The substrate carrying apparatus of the present invention provides a holder on the upper holding base, and during loading of the substrate, after the substrate is transported in place by a manipulator, the substrate is held and hanged by the holder, and the substrate would not undergo a falling process, reducing the risk of substrate damage. The present invention (Continued)

further provides a sputtering device comprising one or more of the substrate carrying apparatuses.

14 Claims, 5 Drawing Sheets

(56) References Cited

FOREIGN PATENT DOCUMENTS

| | | |
|---|---|---|
| CN | 202130871 U | 2/2012 |
| CN | 103936291 A | 7/2014 |
| CN | 104071573 A | 10/2014 |
| DE | 102008015982 B3 | 7/2009 |
| JP | 2011108822 A | 6/2011 |
| JP | 2012089588 A | 5/2012 |
| WO | WO 2013044941 A1 | 4/2013 |

OTHER PUBLICATIONS

Office Action in Chinese Application No. 201510320543.6 dated Aug. 24, 2017, with English translation.
Office Action in Chinese Application No. 201510320543.6 dated Apr. 12, 2017, with English translation. 15 pages.

* cited by examiner

SUBSTRATE CARRYING APPARATUS AND SPUTTERING DEVICE COMPRISING THE SAME

CROSS REFERENCE OF RELATED APPLICATION

The present application claims the benefit of Chinese Patent Application No. 201510320543.6, filed by Jun. 10, 2015, the entire disclosure of which is incorporated herein by reference.

TECHNICAL FIELD

The invention refers to a technical field of display, and specifically to a substrate carrying apparatus and a sputtering device comprising the same.

BACKGROUND

Currently, in the field of manufacturing a liquid crystal display, the transporting of a substrate on a sputtering device relies substantially on vertical transporting by a substrate carrying apparatus. Wherein, as shown in FIG. 1, the substrate carrying apparatus comprises a vertical bearing plate 100, a lower bearing base 200 and an upper holding base 300; the lower bearing base 200 and the upper holding base 300 are provided at the downside and upside of a side surface of the vertical bearing plate 100 respectively, and the vertical bearing plate 100, the lower bearing base 200 and the upper holding base 300 together constitute a carrying space for placing the substrate 400; the upper holding base 300 is provided with multiple positioning clips 500, and the left and right sides of the vertical bearing plate 100 along the carrying space are provided with multiple positioning clips 500, which positioning clips 500 are used for positioning the substrate from the upper end, left end and right end.

When using the substrate carrying apparatus in prior art to transport a substrate 400, the positioning clips 500 are all opened, and the substrate 400 is transported into the carrying space by a manipulator, and placed on the lower bearing base 200; then the positioning clips 500 are closed, and position the substrate 400 from the top end, left end and right end of the substrate 400, so that the positioning and holding and transporting of the substrate 400 on the transporting line is realized. However, during loading the substrate 400 with the substrate carrying apparatus in the prior art, when the manipulator places the substrate 400 on the lower bearing base, the substrate 400 undergoes a falling process, and if the altitude of the manipulator is too high while releasing the substrate 400 in operation, the substrate 400 would impact the lower bearing base 200, so that get damage. Besides, the substrate 400 held by this kind of substrate carrying apparatus easily waggles during the transportation, has a risk of being detached from the positioning clips 500 so as to fall. If the holding forces of the positioning clips 500 are increased, the substrate may easily get damaged, resulting in fragment.

SUMMARY

The object of the application is providing a substrate carrying apparatus, which avoids the falling and damage of the substrate during loading, and further improves the stability of holding the substrate; the application further provides a sputtering device comprising the substrate carrying apparatus.

In an aspect, an embodiment of the invention provides a substrate carrying apparatus, which comprises: a vertical bearing plate and an upper holding base; one side surface of the vertical bearing plate is a bearing surface, the upper holding base is provided at the upside of the bearing surface; the upper holding base is provided with a plurality of holder for holding the substrate; the left and right sides of the bearing surface are provided with a plurality of positioning clips for positioning the substrate from the left and right ends of the substrate.

Therein, the substrate carrying apparatus further comprises a bearing base, which is provided at downside of the bearing surface and disposed oppositely to the upper holding base; the bearing base is provided with a bearing unit for bearing the substrate upwards from the bottom.

Therein, the bearing unit comprises multiple positioning clips.

Alternatively, the bearing unit comprises a supporting cylinder and a supporting plate, the supporting cylinder being provided on the bearing base and the supporting plate being provided on a piston rod of the supporting cylinder.

Therein, the upper holding base and the bearing base are both made by aluminum alloy.

Therein, the holder comprises: a rotation driver, a rotation arm, a fixed splint and a moving splint; the fixed splint is provided at the upper holding base, an upper end of the moving splint is hinged to an upper end of the fixed splint by a hinge, the swing end of the rotation arm is fixedly connected with the moving splint, the driving end of the rotation arm is connected with the rotation driver, and the rotation driver drives the moving splint to rotate around the hinge by the rotation arm, making a clamp constituted by the moving splint and the fixed splint to close or open.

Therein, the rotation driver is an air cylinder, and a cylinder barrel of the air cylinder is hinged to the upper holding base, and the piston rod of the air cylinder is hinged to the driving end of the rotation arm.

Therein, the rotation driver comprises a servo motor and a rotation dish which is rotatable under the driving of the servo motor, and the driving end of the rotation arm is provided with a sliding groove, the rotation dish is provided with a sliding rod, which is interposed in the sliding groove slidably.

Therein, the opposite surfaces of the fixed splint and the moving splint while the clamp constituted by the fixed splint and the moving splint is closed are provided with a holding cushion respectively.

Therein, the holding cushion is made by felt or rubber.

In another aspect, an embodiment of the invention further provides a sputtering device, comprising one or more of the above substrate carrying apparatuses.

The substrate carrying apparatus and the sputtering device comprising the same provided by the embodiments of the present invention provide a holder on the upper holding base, and during loading of the substrate, after the substrate is transported in place by a manipulator, the substrate is held and hanged by the holder, and the substrate would not undergo a falling process, reducing the risk of substrate damage; meanwhile, the downside of the bearing surface is provided with a bearing base, on which a bearing unit is provided, making six degrees of freedom of the substrate to be limited, improving stability of holding the substrate, avoiding falling and damage of the substrate, and further ensuring the safety of transporting the substrate.

BRIEF DESCRIPTION OF FIGURES

In order to more clearly illustrate the technical solutions of the embodiments of the invention or the prior art, the figures needed to be used in the description of the embodiments or the prior art will be simply introduced in the following. Apparently, the figures in the following description only show some embodiments of the invention. For those common skilled in the art, other embodiments can be obtained according to these figures without applying creative effort. It should be understood that, the various parts in the figures may not be drawn to scale, and on the contrary, dimensions of some parts may be exaggerated as required.

DETAIL EMBODIMENTS

The implementations of the invention will be further described in detail below in conjunction with the figures and embodiments. The following embodiments are used for illustrating the invention, but not for limiting the scope of the invention.

In the description of the invention, it should be noted that, unless otherwise stated, "multiple" means two or more than two; the orientations or positional relations indicated by the wordings "up", "down", "left", "right", "inner", "outer", "front-end", "rear-end", "head", "tail", etc. are orientations or positional relations showed based on the figures, and are only used for facilitating and simplifying description of the invention, but not for indicating or implying the apparatus or element has to have a certain orientation, compose and operate at the certain orientation.

Figure 1:
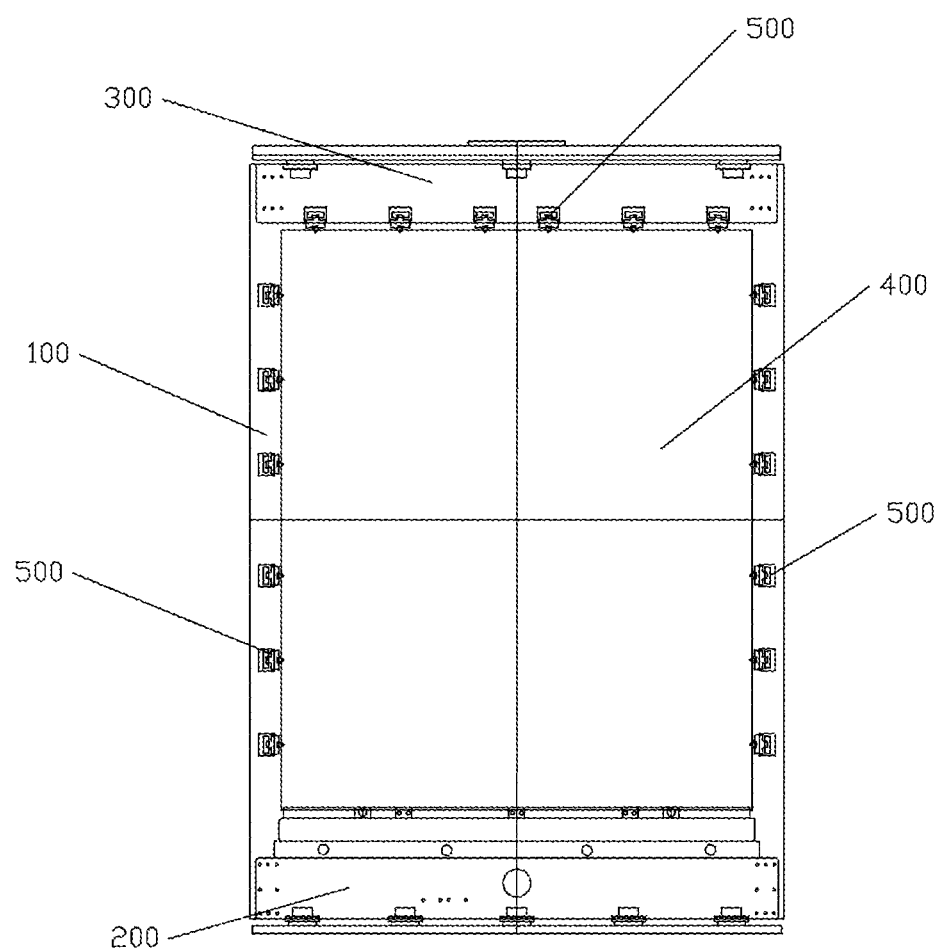
FIG. 1 is a front view of a substrate carrying apparatus in the prior art.
Figure 2:
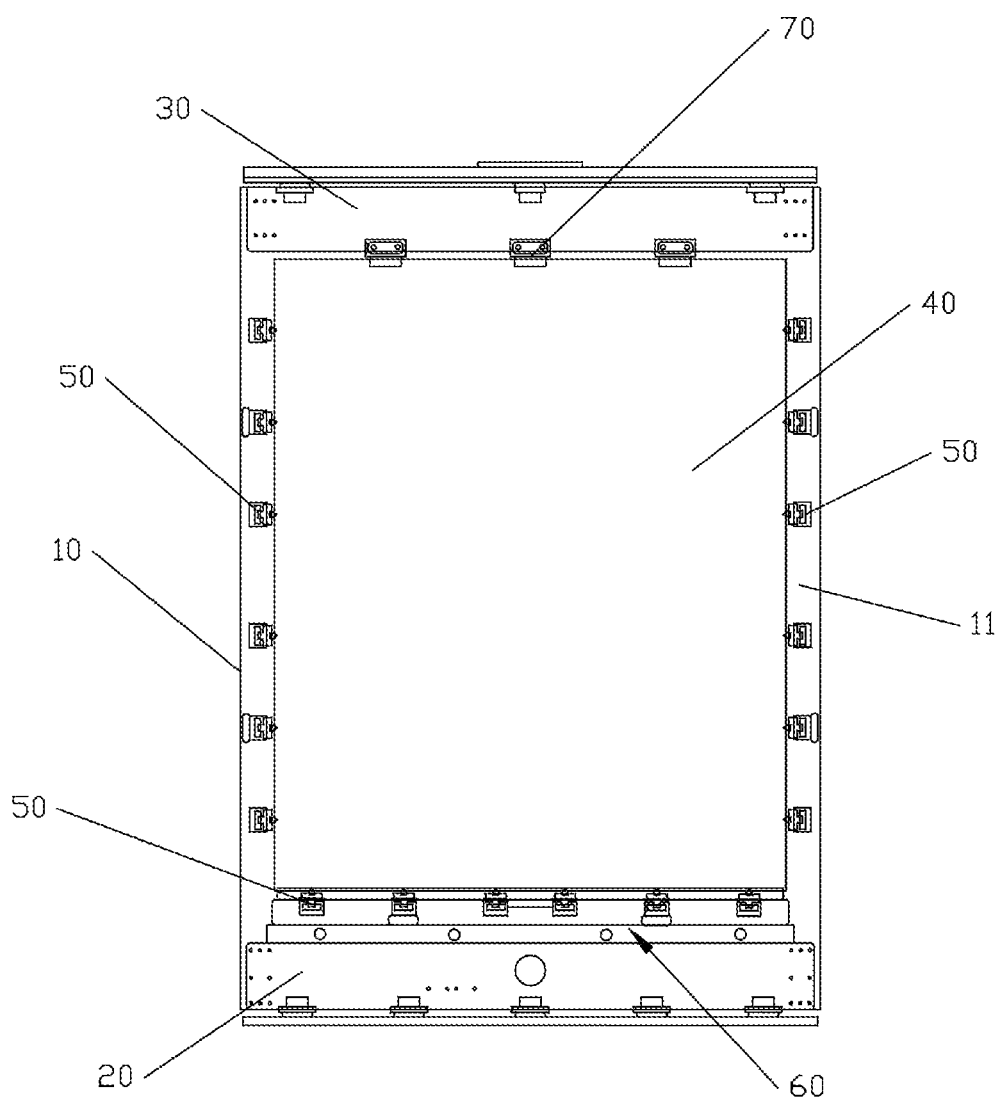
FIG. 2 is a front view of a substrate carrying apparatus according to an embodiment of the invention.
Figure 3:
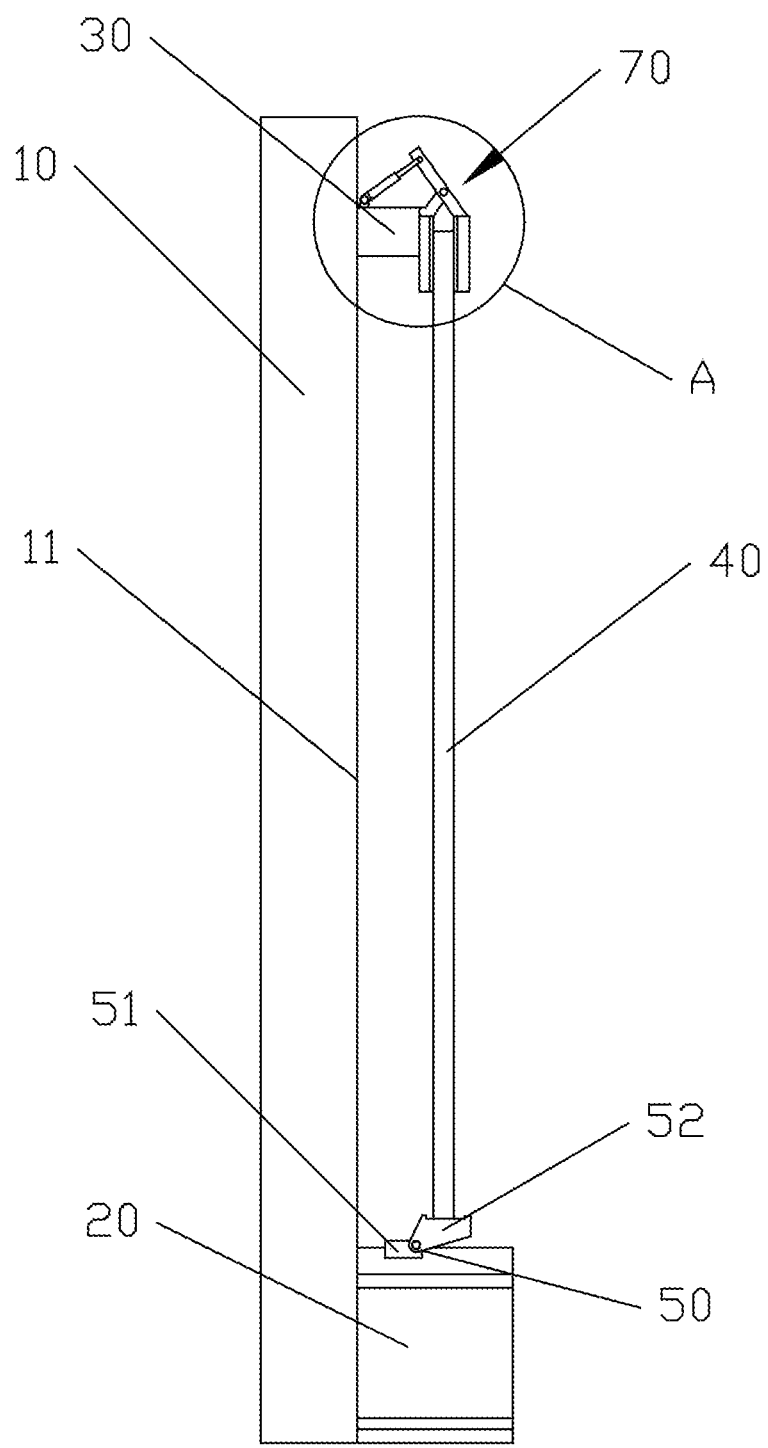
FIG. 3 is a left view of a substrate carrying apparatus according to an embodiment of the invention.
Figure 4:
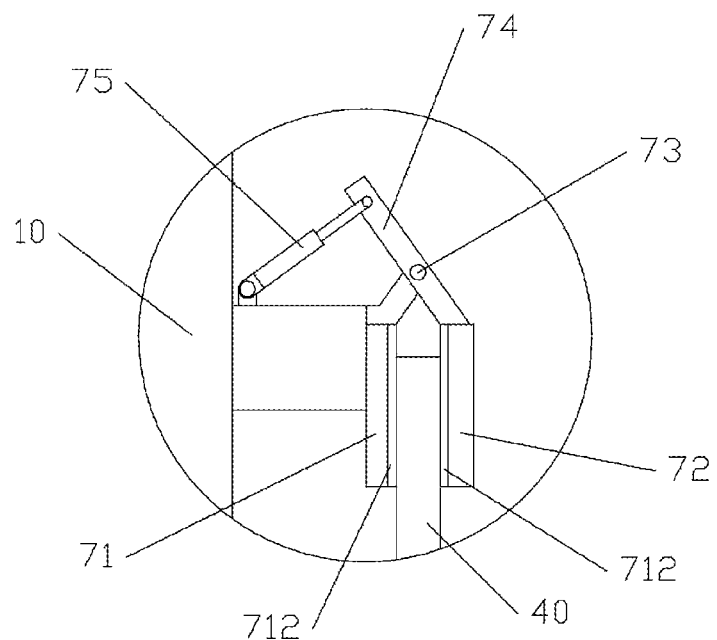
FIG. 4 is an enlarged view of the A portion in FIG. 3.

FIGS. 2 to 4 show a substrate carrying apparatus according to an embodiment of the invention. The apparatus comprises: a vertical bearing plate 10 and an upper holding base 30. One side surface of the vertical bearing plate 10 is a bearing surface 11. As shown in FIG. 2, the front surface of the vertical bearing plate 10 (under the perspective of the viewer) is used as the bearing surface 11, and the upper holding base 30 is provided at the upside of the bearing surface 11. The upper holding base 30 is provided with a plurality of holder 70 for holding the substrate 40. As shown in FIG. 2, the number of the holders 70 is three, but is not limited to three. The left and right sides of the bearing surface 11 are provided with a plurality of positioning clips 50 for positioning the substrate 40 from the left and right ends of the substrate 40.

In operation, the positioning clips 50 and the holders 70 are all opened, and the substrate 40 is transported to the substrate carrying apparatus by a manipulator, and the holders 70 are firstly closed to hold the substrate 40, then the positioning clips 50 are closed and position the substrate 40 from the left end and right end of the substrate 40. The embodiment of the invention employs the holder to hold the substrate 40, and hangs the substrate 40 to the upper holding base 30 of the substrate carrying apparatus. Therefore, when the substrate 40 is loaded to the substrate carrying apparatus, the substrate 40 is not needed to be put down, and does not undergo a falling process, avoiding damage of the substrate 40. Meanwhile, the positioning clips 50 at left and right sides of the bearing surface 11 position the substrate 40 from left and right sides of the substrate 40, making the substrate 40 to have better stability during transportation.

The positioning clips 50 described by the invention will be described in detail below. As shown in FIG. 3, as one embodiment, the positioning clip 50 comprises a swinger 51 and a swinging and clamping arm 52 which rotates under the driving of the swinger 51, and the swinger 51 drives the swinging and clamping arm 52 to rotate, such that makes the swinging and clamping arm 52 to position or limit the substrate.

Further, as shown in FIG. 2, the substrate carrying apparatus further comprises a bearing base 20, which is provided at the down side of the bearing surface 11 and disposed oppositely to the upper holding base 30. The bearing base 20 is provided with a bearing unit 60, for bearing the substrate 40 upwards from the bottom. In the present embodiment, the bearing unit 60 comprises multiple positioning clips 50. By providing the bearing unit 60 at the down side, the substrate 40 can be further born from the bottom of the substrate 40, which ensures that during the whole transportation of the substrate 40, the six degrees of freedom of the substrate 40 are all be limited, further avoids the falling and damage of the substrate 40 and ensures the safety of substrate transportation.

Preferably, the upper holding base 30 and the bearing base 20 are both made by aluminum alloy. The aluminum alloy has a light weight, and has a suitable rigidity, facilitating installing of various components.

As shown in FIGS. 3 and 4, in the present embodiment, the holder 70 comprises: a rotation driver, a rotation arm 74, a fixed splint 71 and a moving splint 72; the fixed splint 71 is provided at the upper holding base 30, an upper end of the moving splint 72 is hinged to an upper end of the fixed splint 71 by a hinge 73, the swing end of the rotation arm 74 is fixedly connected with an upper end of the moving splint 72, the driving end of the rotation arm 74 is connected with the rotation driver, and the rotation driver drives the moving splint 72 to rotate around the hinge 73 by the rotation arm 74, making a clamp constituted by the moving splint 72 and the fixed splint 71 to close or open. In the present embodiment, the rotation driver is an air cylinder 75, and a cylinder barrel of the air cylinder 75 is hinged to the upper holding base 30, and the piston rod of the air cylinder 75 is hinged to the driving end of the rotation arm 74. In operation, the piston rod of the air cylinder stretches out or retracts back, driving the rotation arm 74 to rotate, so that the clamp constituted by the moving splint 72 and the fixed splint 71 is made to close or open. The air cylinder can realize good control of the holder, and has a relatively simple structure.

Further, the opposite surfaces of the fixed splint 71 and the moving splint 72 are provided with a cushion 712. The cushion 712 is made by felt or rubber. Providing a cushion 712 may further prevent the substrate 40 from being crushed.

Figure 5:
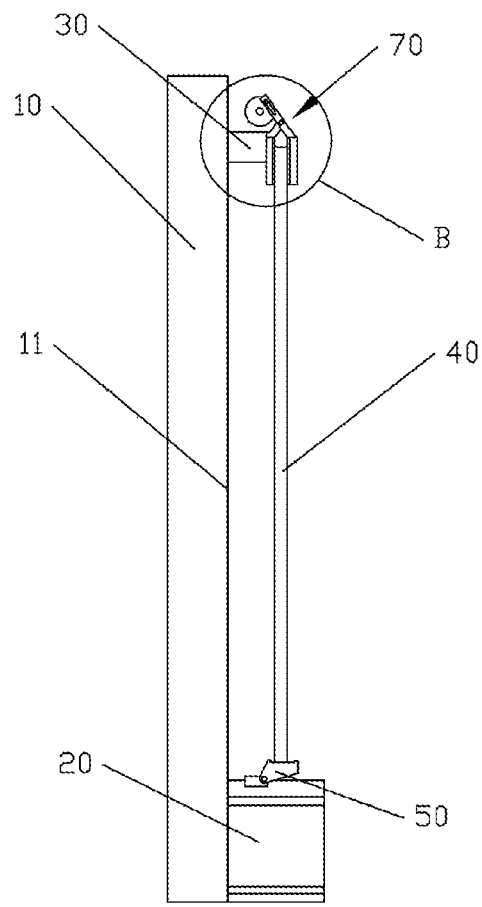
FIG. 5 is a left view of a substrate carrying apparatus according to another embodiment of the invention.
Figure 6:
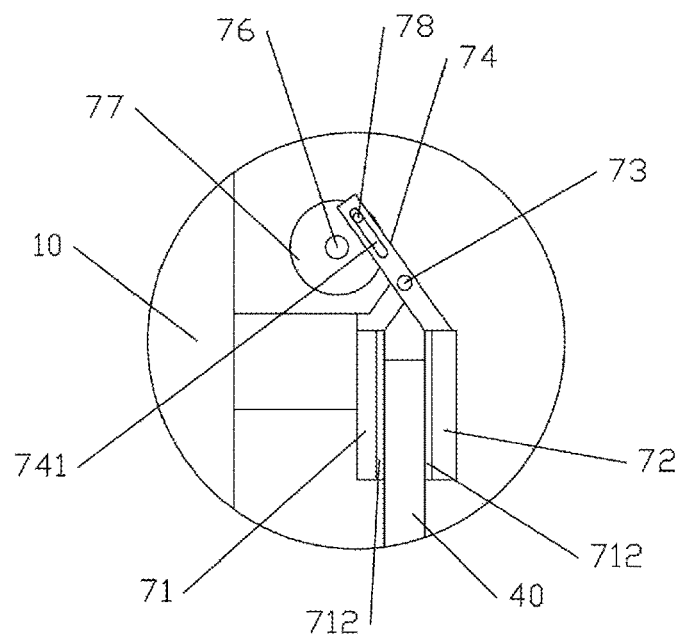
FIG. 6 is an enlarged view of the B portion in FIG. 5.

FIGS. 5 and 6 show a substrate carrying apparatus according to another embodiment of the invention. This embodiment is substantially the same as the above embodiment, except the structure of the rotation driver. In this embodiment, as shown in FIGS. 5 and 6, the rotation driver comprises a servo motor 76 and a rotation dish 77 which is rotatable under the driving of the servo motor 76. The servo motor 76 is fixedly connected with the holding base 30. The driving end of the rotation arm 74 is provided with a sliding groove 741, the rotation dish 77 is provided with a sliding rod 78, which is interposed in the sliding groove 741 slidably. In operation, the servo motor 76 drives the rotation dish 77 to rotate, and the sliding rod 78 moves along the sliding groove 741, so that makes the rotation arm 74 to drive the moving splint 72 to rotate. The servo motor also realizes the function of the holder, and realizes more accurate control of the holder.

Figure 7:
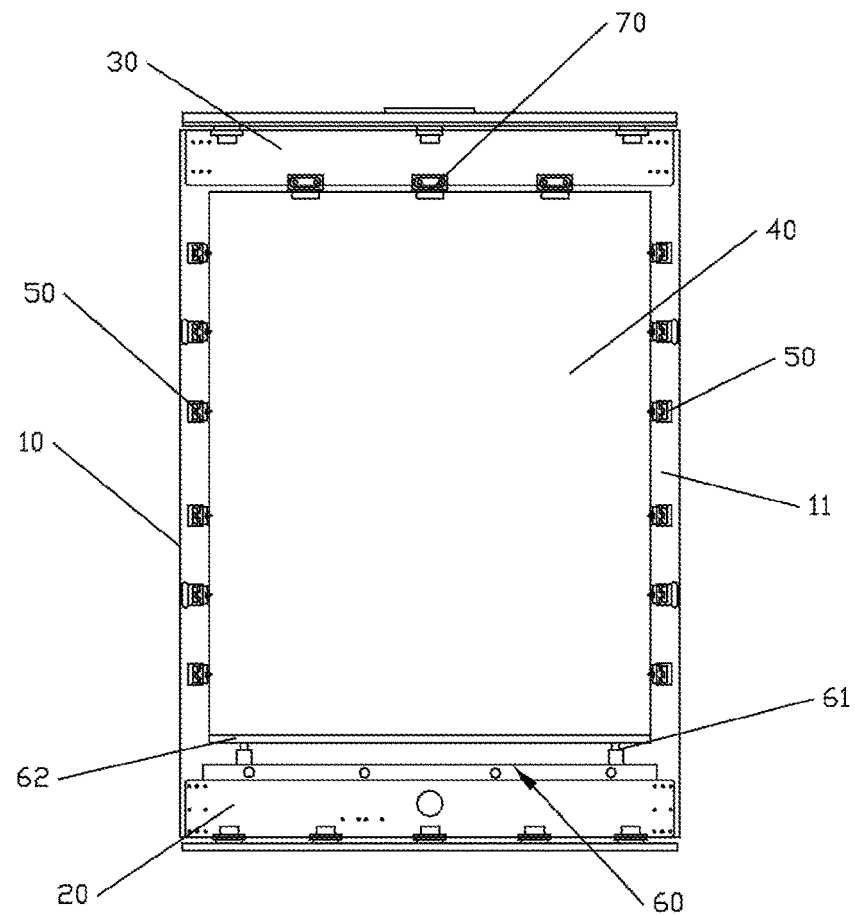
FIG. 7 is a front view of a substrate carrying apparatus according to another embodiment of the invention.

FIG. 7 shows a substrate carrying apparatus according to another embodiment of the invention. This embodiment is substantially the same as the first embodiment, except the structure of the bearing unit 60. In this embodiment, as shown in FIG. 7, the bearing unit 60 comprises a supporting cylinder 61 and a supporting plate 62, the supporting cylinder 61 is vertically provided on the bearing base 20, and the supporting plate 62 is provided on a piston rod of the supporting cylinder 61. As shown in FIG. 7, the number of the supporting cylinder 61 is two, but is not limited to two. In operation, the piston rod of the supporting cylinder 61 stretches out, and drives the supporting plate 62 to rise so as to bear the substrate 40. During loading the substrate 40, the piston rod retracts back, and the supporting plate 62 descends, preventing the substrate 40 from impacting the supporting plate 62. The bearing unit 60 can better realize loading and protecting of the substrate.

The substrate carrying apparatus described in any of the above embodiments can be provided in a sputtering device, for carrying the substrate when the sputtering device makes sputtering processing to the substrate. The sputtering device improves the precision of the sputtering processing, can realize more uniform and stable sputtering processing to the substrate, and can not easily damage the substrate.

The above described are only better embodiments of the invention, and are not intend to limit the invention. Any variations or equivalent substitutions, improvements, etc. made within the sprit and principle of the invention should be covered in the protection scope of the invention. The protection scope of the invention should be only defined by the protection scope of the claims. It should be noted that, the word "comprise" or "comprising" does not exclude presence of elements or steps that are not listed in the claims. The word "a" or "an" preceding an element does not exclude presence of a plurality of such elements. The mere fact that certain measures are recited in mutually different dependent claims does not indicate that a combination of these measures cannot be used to advantage. Any reference signs in the claims should not be construed as limiting the scope.

The invention claimed is:

1. An apparatus for carrying a substrate, comprising:
a vertical bearing plate having a side surface as a bearing surface, the bearing surface being provided at left and right sides thereof with a plurality of positioning clips for positioning the substrate from left and right ends of the substrate; and
an upper holding base provided at an upside of the bearing surface, the upper holding base being provided with a plurality of holders for holding the substrate, each of the holders comprising:
a fixed splint provided at the upper holding base;
a moving splint for forming a clamp with the fixed splint;
a rotation arm having a driving end and a swing end, the rotation arm being hinged, at a point between the driving end and the swing end, to an upper end of the fixed splint, the swing end being fixedly connected with an upper end of the moving splint; and
a rotation driver connected with the driving end of the rotation arm, the rotation driver being configured to cause the clamp formed by the moving splint and the fixed splint to close by pushing the driving end, and to cause the clamp formed by the moving splint and the fixed splint to open by pulling the driving end.

2. The apparatus of claim 1, further comprising a bearing base provided at a downside of the bearing surface and disposed oppositely to the upper holding base, wherein the bearing base is provided with a bearing unit for bearing the substrate upwards from bottom.

3. The apparatus of claim 2, wherein the bearing unit comprises multiple positioning clips.

4. The apparatus of claim 2, wherein the bearing unit comprises:
a supporting cylinder comprising a piston rod and being provided on the bearing base; and
a supporting plate being provided on the piston rod.

5. The apparatus of claim 2, wherein the upper holding base and the bearing base are both made by aluminum alloy.

6. The apparatus of claim 1, wherein the rotation driver is an air cylinder comprising a cylinder barrel hinged to the upper holding base, and a piston rod hinged to the driving end of the rotation arm.

7. The apparatus of claim 1, wherein the rotation driver comprises a servo motor and a rotation dish which is rotatable under driving of the servo motor, wherein the driving end of the rotation arm is provided with a sliding groove, and wherein the rotation dish is provided with a sliding rod interposed in the sliding groove slidably.

8. The apparatus of claim 1, wherein opposite surfaces of the fixed splint and the moving splint while the clamp formed by the fixed splint and the moving splint is closed are each provided with a holding cushion.

9. The apparatus of claim 8, wherein the holding cushion is made by felt or rubber.

10. A sputtering device, comprising one or more of the apparatuses of claim 1.

11. A sputtering device, comprising one or more of the apparatuses of claim 2.

12. A sputtering device, comprising one or more of the apparatuses of claim 4.

13. A sputtering device, comprising one or more of the apparatuses of claim 6.

14. A sputtering device, comprising one or more of the apparatuses of claim 7.

* * * * *